United States Patent
Bretchko et al.

(10) Patent No.: US 7,750,734 B2
(45) Date of Patent: Jul. 6, 2010

(54) APPARATUS AND METHODS FOR AMPLIFIERS

(75) Inventors: Pavel Bretchko, Reading, MA (US);
Shuyun Zhang, Allston, MA (US);
Royal Gosser, Raleigh, NC (US)

(73) Assignee: Analog Devices, Inc., Norwood, MA (US)

( * ) Notice: Subject to any disclaimer, the term of this patent is extended or adjusted under 35 U.S.C. 154(b) by 27 days.

(21) Appl. No.: 12/077,895

(22) Filed: Mar. 21, 2008

(65) Prior Publication Data

US 2008/0231370 A1   Sep. 25, 2008

Related U.S. Application Data

(60) Provisional application No. 60/919,686, filed on Mar. 23, 2007.

(51) Int. Cl.
*H03F 1/26* (2006.01)
(52) U.S. Cl. ..................... 330/149; 330/278
(58) Field of Classification Search ............. 330/311, 330/149, 151; 455/114.3
See application file for complete search history.

(56) References Cited

U.S. PATENT DOCUMENTS 6,081,159 A * 6/2000 Kim et al. ................. 330/149
7,224,222 B2 * 5/2007 Yum et al. ................. 330/149
7,259,621 B2 * 8/2007 Kusunoki et al. .......... 330/149
7,308,234 B2 * 12/2007 Kintis ..................... 455/114.1

OTHER PUBLICATIONS

Data Sheet for Analog Devices, "2 GHz Ultralow Distortion Differential RF/IF Amplifier—AD8352," pp. 1-20 (2006).
Data Sheet for Analog Devices, "Ultralow Distortion IF Dual VGA—AD8376," pp. 1-24 (2007).
Toumazou et al., "Analogue IC Design: The Current-Mode Approach," p. 190 (1990) (plus cover pages).
Data Sheet for Analog Devices, "Ultralow Distortion IF Dual VGA—AD8376," pp. 1-24 (2007).

* cited by examiner

*Primary Examiner*—Robert Pascal
*Assistant Examiner*—Hieu P Nguyen
(74) *Attorney, Agent, or Firm*—Knobbe, Martens, Olson & Bear LLP (57) ABSTRACT

Circuits and methods for reducing distortion in an amplified signal are disclosed. The circuits and methods may use multiple single-ended gain stages to produce multiple amplified signals. The amplified signals may be processed in combination to produce a resulting output signal having little, or no, distortion. The circuits may be implemented on a single chip as integrated circuits.

12 Claims, 10 Drawing Sheets

APPARATUS AND METHODS FOR AMPLIFIERS

CROSS-REFERENCE TO RELATED APPLICATIONS

This Application is a Non-Provisional of, and claims the benefit under 35 U.S.C. §119(e) of, U.S. Provisional Patent Application Ser. No. 60/919,686, filed on Mar. 23, 2007, entitled "A Linearization Technique for Amplifier," and which is hereby incorporated by reference in its entirety.

BACKGROUND

1. Field

The technology described herein relates to methods and apparatus for reduction of distortion in active devices.

2. Related Art

Figure 1A:
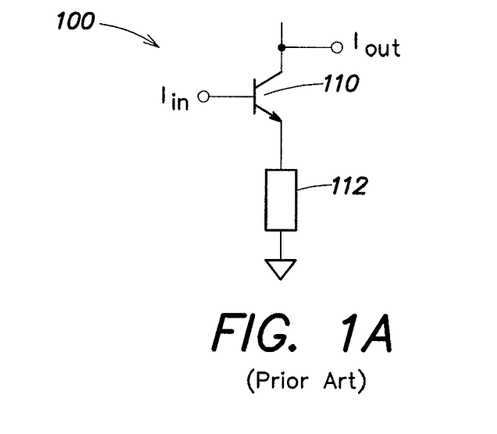
FIG. 1A illustrates a conventional amplifier.

Most, if not all, active devices (e.g., amplifiers) exhibit non-linearity. FIG. 1A illustrates a conventional single stage amplifier 100. The amplifier 100 includes a transistor 110, illustrated as a bipolar junction transistor (BJT), in combination with an impedance 112. The transistor 110 receives an input signal $I_{in}$ at its base terminal, and provides an output signal $I_{out}$ at its collector terminal. The impedance 112 is connected between the emitter terminal of the transistor 110 and ground.

Figure 1B:
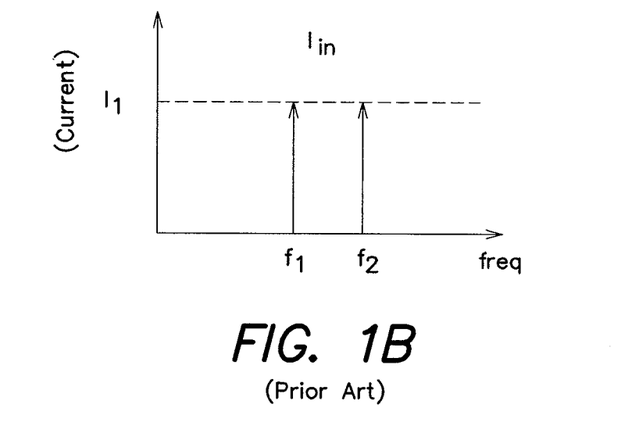
FIGS. 1B and 1C illustrate input and output signals, respectively, of the amplifier of FIG. 1A.

The non-linearity of the amplifier 100 is illustrated with reference to FIGS. 1B and 1C. As shown in FIG. 1B, the input signal $I_{in}$ to transistor 110 is a two tone input signal, including a tone having a frequency $f_1$ and a second tone having a frequency $f_2$. The two tones have equal amplitudes $I_{in}$. The output signal $I_{out}$ (shown in FIG. 1C) from the collector terminal of transistor 110 includes amplified signals at frequencies $f_1$ and $f_2$, having magnitudes $I_2$. In addition, the output signal $I_{out}$ is distorted, including tones at frequencies of $2f_1-f_2$ and $2f_2-f_1$, having magnitudes $I_3$. These frequencies are known as intermodulation distortion. Other frequencies of distortion can be present, such as distortion at the harmonic frequencies of the input signals.

SUMMARY

According to an aspect of the invention, an apparatus comprises an integrated circuit (IC). The IC comprises a first single-ended gain stage configured to receive an input signal, amplify the input signal, and produce a first amplified signal. The IC further comprises a second single-ended gain stage in parallel with the first single-ended gain stage and configured to receive the input signal, amplify the input signal, and produce a second amplified signal. The IC further comprises an inverter coupled to the second single-ended gain stage and configured to receive the second amplified signal and produce an inverted signal representing an inversion of the second amplified signal.

According to another aspect of the invention, an apparatus comprises an integrated circuit (IC). The IC comprises a first single-ended gain stage configured to receive an input signal, amplify the input signal, and produce a first amplified signal. The IC further comprises an inverter configured to receive the input signal and produce an inverted version of the input signal. The IC further comprises a second single-ended gain stage having an input coupled to an output of the inverter to receive the inverted version of the input signal, amplify the inverted version of the input signal, and produce a second amplified signal. The IC further comprises an adder configured to receive the first amplified signal and the second amplified signal and add them together.

According to another aspect of the invention, a method of producing an amplified signal is provided. The method comprises amplifying an input signal using a first single-ended gain stage to produce a first amplified signal. The method further comprises amplifying the input signal using a second single-ended gain stage to produce a second amplified signal. The method further comprises inverting the second amplified signal to produce an inverted signal, and combining the first amplified signal and the inverted signal.

BRIEF DESCRIPTION OF THE DRAWINGS

The drawings included herein are intended to serve as an example only, and do not limit the claims in any way. It will also be appreciated that some, or all, of the drawings are not to scale. In the drawings:

DETAILED DESCRIPTION

Figure 1C:
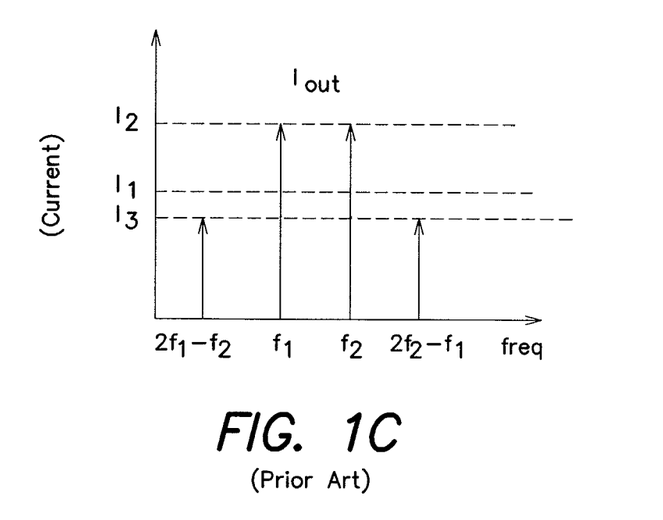

As mentioned with respect to FIGS. 1A-1C, active devices may produce distorted output signals. The distortion can be one of various types, such as intermodulation distortion, distortion at the harmonic frequencies, or other types of distortion. Distortion at some frequencies can be filtered from the output signal. However, some distortion, such as intermodulation distortion, and particularly third-order intermodulation distortion, may occur too close to the desired output frequencies to be accurately filtered without degrading the desired output frequencies.

Accordingly, circuits and methods are discussed herein for reducing, or eliminating entirely, distortion, such as intermodulation distortion, from output signals of single-ended active devices. According to one aspect, a method comprises inputting a signal that is to be amplified to two single-ended gain stages in parallel, each of which may produce a respective amplified output signal. The output signal of one of the single-ended gain stages can be a high quality output signal, including relatively large amplification of the desired output frequencies, and relatively little intermodulation distortion. The output signal of the other single-ended amplifier can be a poorly amplified signal, having very little amplification of the desired output frequencies but a relatively large amount of intermodulation distortion. One of the two amplified output signals can then be inverted and added to the other of the amplified output signals, therefore producing a combined output signal having a reduced amount of intermodulation distortion compared to the signals output by the single-ended gain stages.

According to another aspect, a circuit is provided for producing an amplified output signal having little, or no, intermodulation distortion. The circuit, which may be an integrated circuit implemented on a single chip, may comprise two single-ended gain stages. A common input signal, which may be a single tone (frequency) or a multi-tone signal, may be provided to both of the single-ended gain stages, and each gain stage may produce a respective amplified signal. One of the gain stages may be a high quality gain stage, producing an amplified signal having little intermodulation distortion relative to the desired output signal. The other single-ended gain stage may be a poor quality gain stage, producing an amplified signal having a relatively low magnitude of the desired output frequencies, but a relatively large magnitude of intermodulation distortion. The circuit may further comprise an inverter coupled to the output of the second single-ended gain stage, to receive the amplified signal from the second single-ended gain stage, and to produce an inverted version of that signal. The circuit may further comprise an adder to receive the inverted signal produced by the inverter and the amplified signal output by the high quality single-ended gain stage, and to combine these two signals to produce an output signal of the circuit. The output signal of the circuit may therefore comprise little, or no, intermodulation distortion, and particularly may comprise little, or no, third-order intermodulation distortion.

Figure 2A:
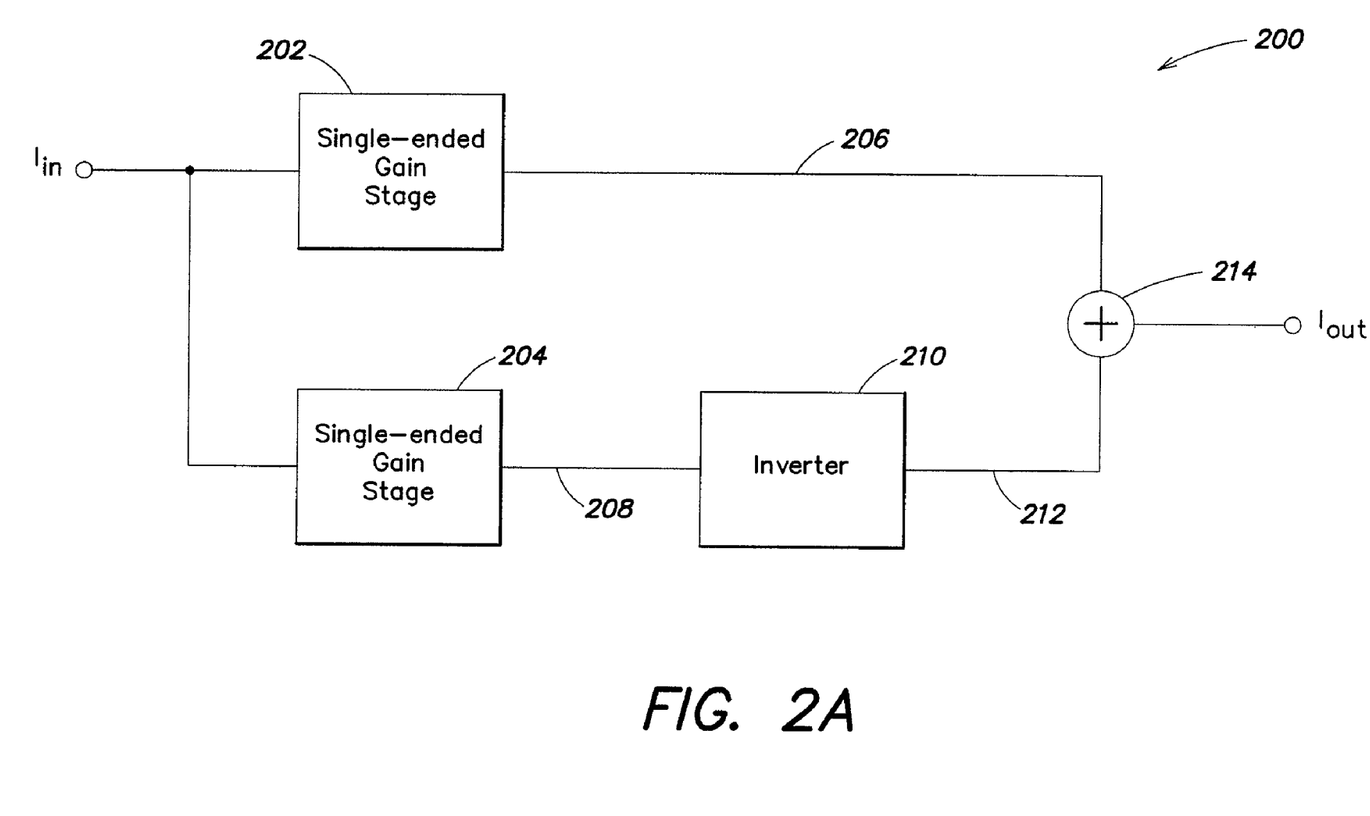
FIGS. 2A-2B illustrate alternative embodiments, in block diagram form, of a circuit for producing an amplified signal having little, or no, distortion.

FIG. 2A illustrates a block diagram representation of a circuit configured to provide an amplified output signal having little, or no, intermodulation distortion. The circuit 200 includes two single-ended gain stages, 202 and 204. One of the two single-ended gain stages may be a high quality gain stage, while the other single-ended gain stage may be a low quality gain stage. For example, single-ended gain stage 202 may be a high quality gain stage, capable of producing an output signal amplified relative to an input signal, with little distortion. The single-ended gain stage 204, by contrast, may be designed to produce an amplified signal including only a slight amplification of the input signal and a relatively large amount of intermodulation distortion, as will be described further in relation to FIG. 3.

As illustrated, single-ended gain stages 202 and 204 are configured in parallel. Each single-ended gain stage receives an input current signal $I_{in}$. While the input signal is illustrated as an input current, it will be appreciated that this is non-limiting, as the input signal may alternatively be an input voltage. Furthermore, it will be appreciated that while both single-ended gain stages are shown, and described, as receiving the same input signal, the single-ended gain stages may not receive identical signals. For example, a pre-amplifier may be included in circuit 200 before one or both of single-ended gain stages 202 and 204, such that the signal input to single-ended gain stage 202 may differ in magnitude from the signal input to single-ended gain stage 204. However, even in this type of situation, both single-ended gain stages can accurately be described as receiving the same input signal.

The single-ended gain stage 202 may produce its amplified output signal on line 206, while the single-ended gain stage 204 may produce its amplified output signal on line 208. As mentioned above, the single-ended gain stage 202 may be a high quality amplifier, while the single-ended gain stage 204 may be a poor amplifier, although the aspect of the invention relating to a circuit for providing an amplified signal having little, or no, intermodulation distortion is not limited to comprising a high quality gain stage and a low quality gain stage. As a non-limiting example, the input signal $I_{in}$ may be a multi-frequency signal comprising a first frequency and a second frequency. The single-ended gain stage 202 may produce an amplified signal on line 206 comprising the first and second frequencies, amplified by a factor of two (2) or more. The amplified signal on line 206 may also comprise third order intermodulation distortion, for example, having a magnitude less than approximately ½ the magnitude of the amplified first and second frequencies. In one implementation, the third order intermodulation distortion may have a magnitude less than approximately ¼ of the magnitude of the amplified first and second frequencies. Meanwhile, the single-ended gain stage 204 may produce an amplified signal on line 208 which amplifies the first and second input frequencies by less than a factor of two, and which further comprises third order intermodulation distortion having a magnitude approximately equal to the magnitude of third order intermodulation distortion in the amplified signal on line 206.

The circuit 200 further comprises an inverter 210. The inverter 210 may be any type of inverter, and may take any physical implementation, as the aspect of the invention related to a circuit for providing an amplified output signal having little, or no, intermodulation distortion is not limited in this respect. The inverter 210 is configured to receive the amplified output signal from single-ended gain stage 204 on line 208, and to produce on line 212 an inverted version of the signal on line 208. The inverted signal on line 212 may be approximately equal in magnitude, but approximately 180 degrees out-of-phase with, the signal on line 208. However, it will be appreciated that the magnitude and phase of the inverted signal on line 212 may be adjusted to have any desired relationship relative to the magnitude and phase of the signal on line 208.

In circuit 200, the amplified signal on line 206 and the inverted signal on line 212 are combined in an adder 214, which provides the output signal $I_{out}$ of the circuit. However, it will be appreciated that the adder 214 is one non-limiting example of how the signals of lines 206 and 212 may be combined, and that other implementations are possible.

It will be appreciated that the circuit 200 illustrated in FIG. 2A may be implemented in various ways, and the aspect of the invention relating to a circuit providing an amplified output signal having little, or no, intermodulation distortion is not limited to any particular physical implementation. Moreover, it will be appreciated that the circuit components illustrated in FIG. 2A may be rearranged and/or combined with one or more additional circuit components to achieve substantially the same functionality. For example, FIG. 2B illustrates a block diagram of an alternative circuit providing substantially the same functionality as that illustrated in FIG. 2A.

Figure 2B:
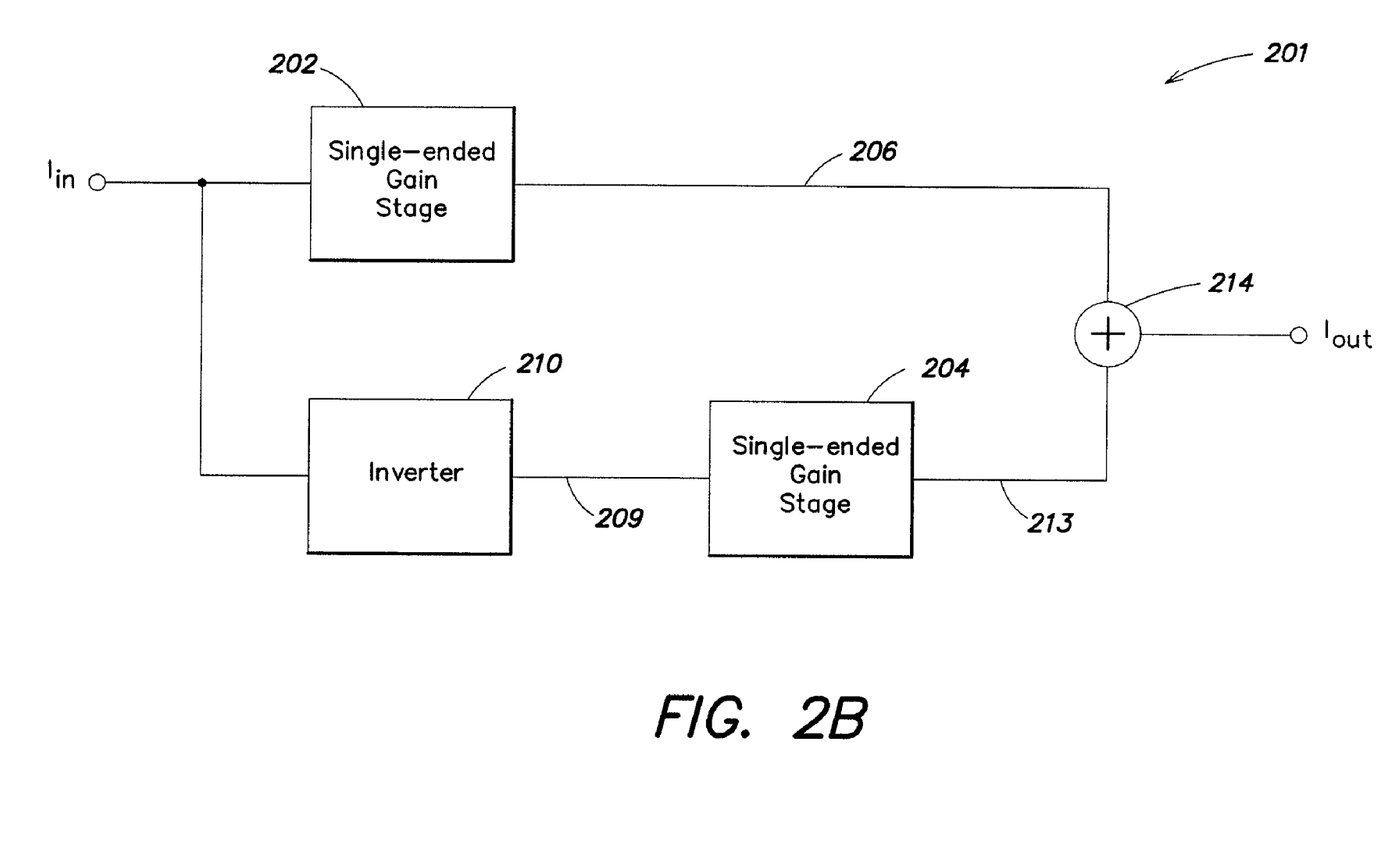

In FIG. 2B, the circuit 201 comprises several of the same components present in the circuit 200 of FIG. 2A. As shown, single-ended gain stage 202 receives the input signal $I_{in}$ and may produce a high quality amplified signal on line 206, as previously described. In the non-limiting example of FIG. 2B, the inverter 210 is configured in front of single-ended gain stage 204 to directly receive the input signal $I_{in}$ and produce an inverted version of the input signal $I_{in}$ on line 209. The signal on line 209 may be approximately equal in magnitude but approximately 180 degrees out-of-phase with the input signal $I_{in}$. In circuit 201, single-ended gain stage 204 is configured to receive the signal on line 209 and produce an amplified version of that signal on line 213. Single-ended gain stage 204 may be a low quality amplifier and may produce a low quality amplified signal on line 213, as also described previously. In circuit 201, the adder 214 receives the signals on lines 206 and 213 and adds them to produce the output signal, $I_{out}$, of the circuit 201 having little, or no, intermodulation distortion. While circuit 201 is one non-limiting example of a circuit providing an amplified output signal having little, or no, intermodulation distortion, it will be appreciated that this aspect is not limited to any particular implementation of the circuit components.

Figure 3:
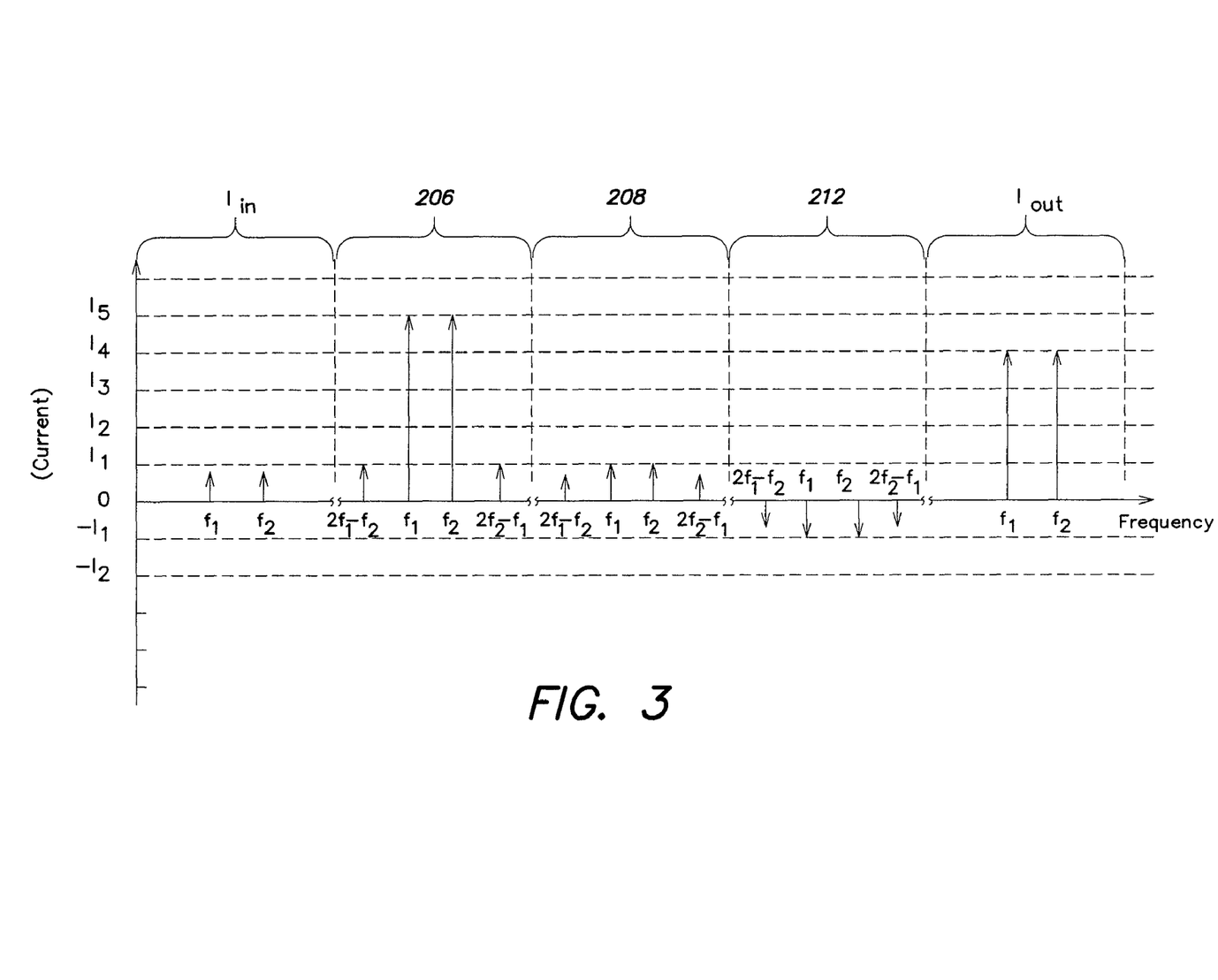
FIG. 3 is an example of signals associated with the circuit 200 of FIG. 2A.

FIG. 3 illustrates one non-limiting example of the signals present at five stages of circuit 200 in FIG. 2A. It will be appreciated that the signals shown in FIG. 3 are for purposes of example only, and that the magnitude, frequency, or other characteristics of the signals may be different from those shown. The x-axis represents the frequency of the signals, although it will be appreciated that the frequencies illustrated are merely examples, as the various signals may include more or less frequencies than those shown. Also, it will be appreciated that the x-axis is not a continuous scale (as shown by the breaks in the x-axis line), but rather the frequency values of the signals are labeled within each region of the x-axis corresponding to the five illustrated stages. Similarly, the y-axis shows the current corresponding to each signal. The units for the x-axis and y-axis are non-limiting, and are represented in generic units ($I_1$-$I_5$ for current; frequencies labeled as $f_1$, $f_2$, etc.).

In the non-limiting example of FIG. 3, the input signal $I_{in}$ is a multi-frequency signal comprising two tones $f_1$, and $f_2$, each having a magnitude of approximately $I_1$. As indicated in FIG. 2A, the input signal $I_{in}$ is input to single-ended gain stage 202, which provides an amplified signal on line 206. As shown in FIG. 3, the amplified signal on line 206 may exhibit good amplification of the signals at the input frequencies of $f_1$ and $f_2$, and also includes intermodulation distortion at the frequencies of $2f_1$-$f_2$ and $2f_2$-$f_1$. The amplified frequencies $f_1$ and $f_2$ may have a magnitude of $I_5$, five times greater than the magnitudes of the input frequencies, and the third order intermodulation distortion ($2f_1$-$f_2$ and $2f_2$-$f_1$) may have a magnitude of $I_1$.

The input signal $I_{in}$ is also input to single-ended gain stage 204, which provides an amplified signal on line 208. As shown in FIG. 3, the amplified signal on line 208 may provide little amplification of the input signals $f_1$ and $f_2$, and also includes a relatively large amount of third order intermodulation distortion at frequencies $2f_1$-$f_2$ and $2f_2$-$f_1$. In the non-limiting example illustrated, the magnitude of frequencies $f_1$ and $f_2$ on line 208 is approximately $I_1$, while the magnitude of the third order intermodulation distortion is slightly less than $I_1$.

Inverter 210 receives the amplified signal on line 208 and may produce an inverted signal on line 212. In the non-limiting example of FIG. 3, the signal on line 212 is approximately equal in magnitude to the signal on line 208 (i.e., the absolute value of the signals on lines 208 and 212 are approximately equal), but approximately 180 degrees out-of-phase with the signal on line 208. The output signal $I_{out}$ may be provided from adder 214, and may be the combination of the amplified signal on line 206 and the inverted signal on line 212. As shown in FIG. 3, the output signal $I_{out}$ may include frequencies $f_1$ and $f_2$ having a magnitude substantially amplified compared to that of the corresponding frequencies of the input signal $I_{in}$, but slightly lower than the magnitude of the corresponding frequencies in the amplified signal on line 206. The output signal $I_{out}$, however, does not include third order intermodulation distortion at frequencies $2f_1$-$f_2$ and $2f_2$-$f_1$, because the intermodulation distortion in the signal on line 212 approximately cancels the intermodulation distortion in the amplified signal on line 206. From this non-limiting example, it will be appreciated that the circuit components may be designed (e.g., the gain values of single-ended gain stages 202 and 204, the operating characteristics of inverter 210, etc.) to provide a minimal amount of intermodulation distortion in the output signal $I_{out}$, while still providing amplification of the input signal.

Figure 4:
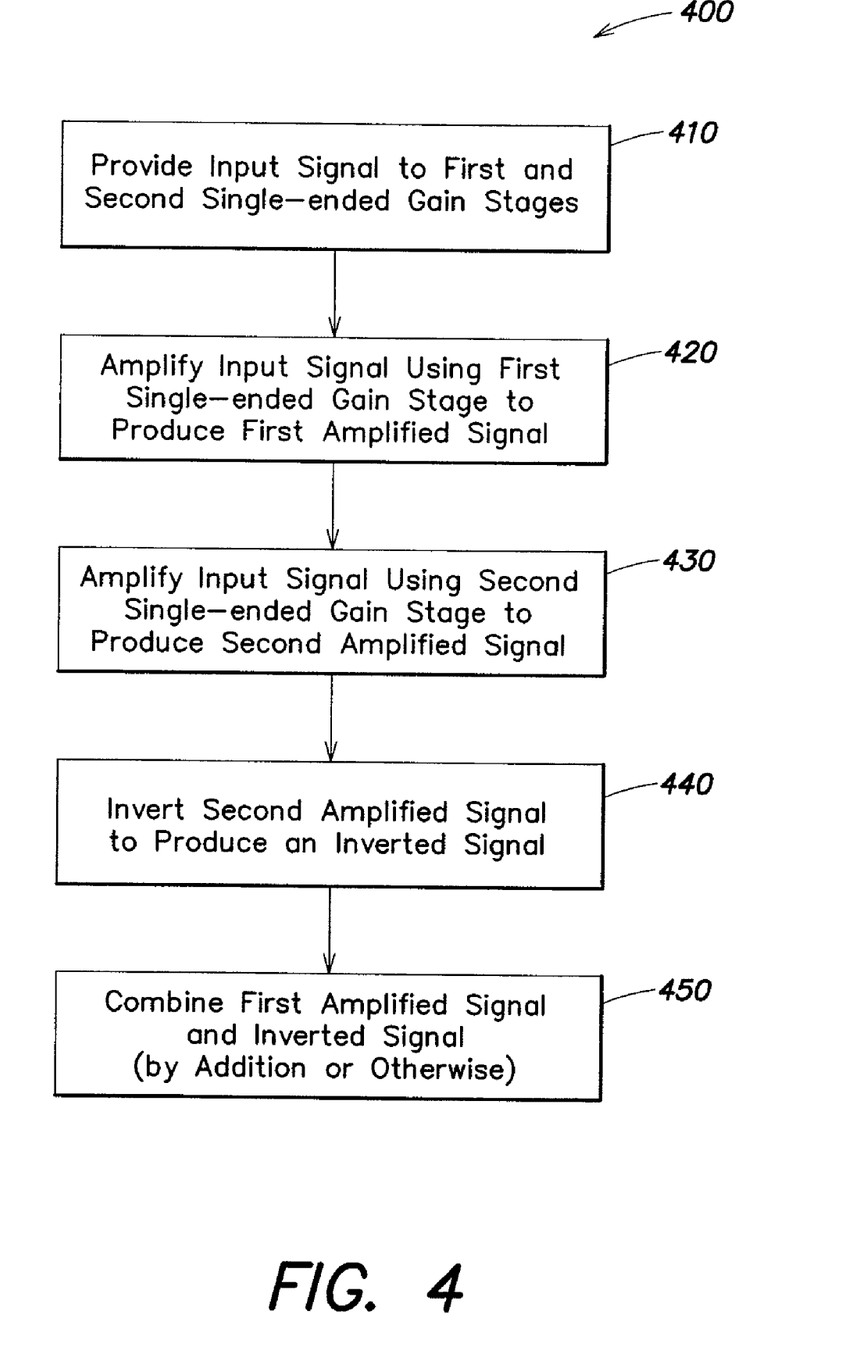
FIG. 4 is a method of producing an amplified signal having little, or no, distortion, according to one embodiment.

FIG. 4 illustrates a method of providing an amplified signal having little, or no, distortion (e.g., intermodulation distortion), according to one aspect of the invention. It will be appreciated that the order listed in FIG. 4 is non-limiting, as the various acts may be arranged in any suitable order to achieve an amplified output signal having little, or no, distortion. The method 400 begins at 410 by providing an input signal, which may be a current signal or a voltage signal, to first and second single-ended gain stages. At 420, the input signal is amplified using the first single-ended gain stage to produce a first amplified signal. In one implementation, the first single-ended gain stage may be a high quality gain stage, such that the first amplified signal may amplify the input signal with relatively little distortion. However, the aspect of the invention relating to a method of providing an output signal having little, or no, distortion is not limited in this respect.

At 430, the input signal is amplified using the second single-ended gain stage to produce a second amplified signal. In one non-limiting implementation, the second single-ended gain stage is a low quality gain stage, such that the second amplified signal only slightly amplifies the input frequencies of the input signal, while producing a relatively large amount of distortion. However, the second gain stage may alternatively be a high quality gain stage, as the type of gain stage is not limiting.

At 440, the second amplified signal is inverted using an inverter to produce an inverted signal. The inverted signal may be approximately equal in magnitude, but approximately 180 degrees out-of-phase with, the second amplified signal. At 450, the first amplified signal and the inverted signal are combined. For example, the first amplified signal and the inverted signal maybe added together, or combined in any suitable manner. In one non-limiting implementation, the addition of the inverted signal and the first amplified signal cancels distortion present in the first amplified signal, without causing significant reduction in the magnitude of the desired output frequencies.

While FIG. 4 illustrates one non-limiting exemplary method for producing an amplified output signal having little, or no, distortion, other methods are possible. For example, the order of acts illustrated in FIG. 4 may be rearranged as appropriate, such as to illustrate the operation of circuit 201 of FIG. 2B. Furthermore, one or more additional acts may be added to the method 400. For example, one or more additional inversion acts may be added to the method to provide a different output signal from that provided by the method of FIG. 4, or for any other reason. Other methods are also possible.

As has been mentioned, one aspect of the invention is directed to a circuit providing an amplified output signal having little, or no, intermodulation distortion. FIGS. 2A and 2B illustrate two non-limiting block diagram examples of such circuits. Circuits 200 and 201 from FIGS. 2A and 2B, respectively, may be implemented in any suitable manner, and are not limited to any particular physical implementation. Furthermore, they are each capable of being implemented as integrated circuits on a single chip.

Figure 5:
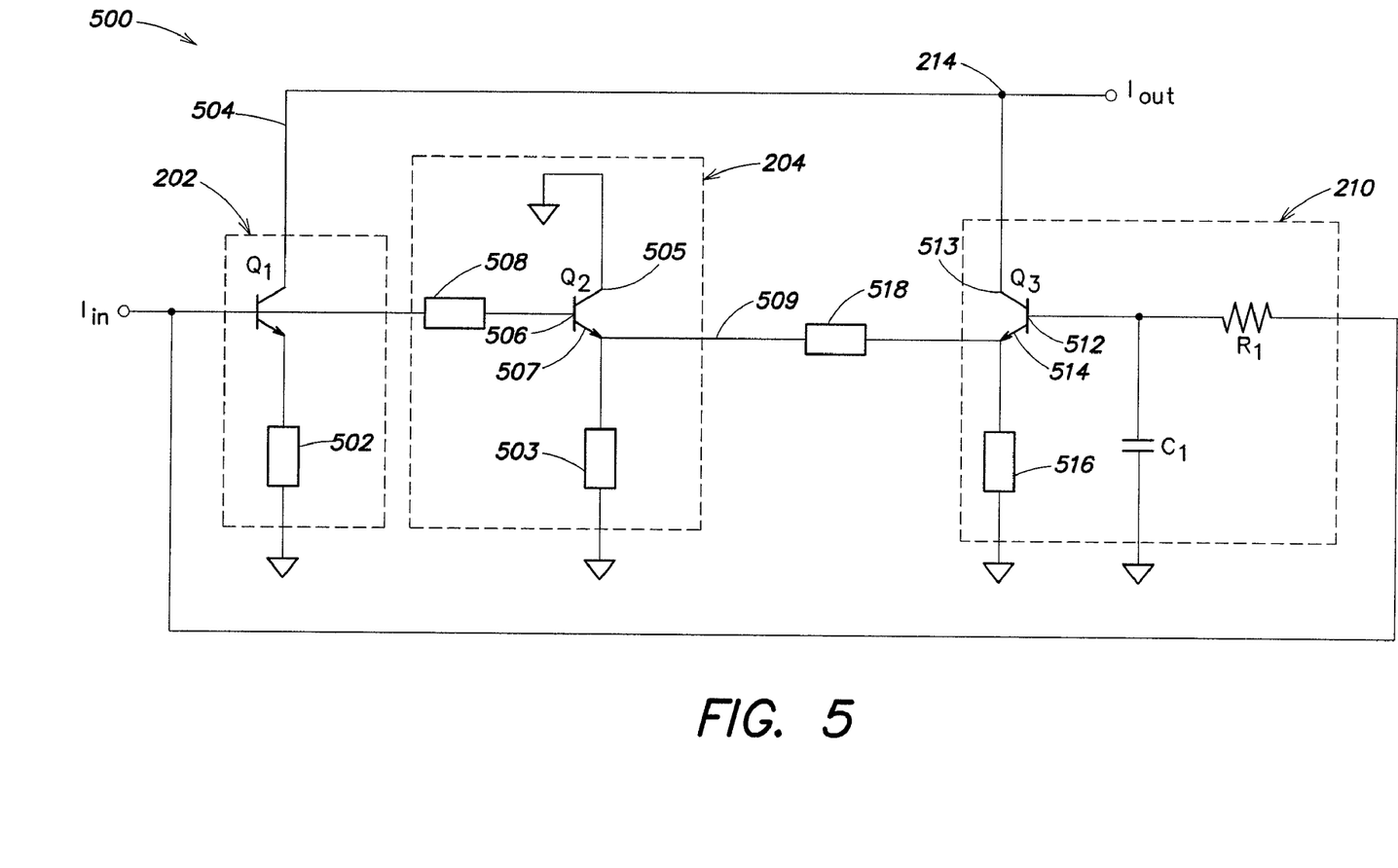
FIG. 5 is a simplified circuit schematic of one exemplary implementation of circuit 200 from FIG. 2A.

FIG. 5 illustrates one non-limiting simplified circuit schematic of an exemplary implementation of circuit 200 from FIG. 2A. It will be appreciated that other implementations are possible. The circuit 500 is configured to receive an input signal $I_{in}$ and produce an amplified output signal $I_{out}$. In simplified form, the circuit may be implemented with three transistors, and a plurality of impedance components. Single-ended gain stage 202 from FIG. 2A may be implemented as a transistor $Q_1$ coupled to an emitter degeneration impedance 502, which is also coupled to ground. The transistor $Q_1$, illustrated as a bipolar junction transistor (BJT), receives the input signal $I_{in}$ at its base terminal, and provides a first amplified signal at its collector terminal on line 504. The emitter degeneration impedance 502 may function to bias the transistor $Q_1$, and therefore may have any suitable value. Furthermore, the emitter degeneration impedance 502 may be implemented as a resistor, or any other suitable electronic component. According to one implementation, the single-ended gain stage 202 implemented using transistor $Q_1$ coupled to emitter degeneration impedance 502 (which itself is grounded) is a high quality amplifier, such that the amplified signal on line 504 amplifies the input frequencies of input signal $I_{in}$ with little intermodulation distortion.

In circuit 500, the second single-ended gain stage 204 comprises a second transistor $Q_2$ configured in parallel to transistor $Q_1$. Transistor $Q_2$ has a base terminal 506 configured to receive the input signal $I_{in}$ via an impedance 508. Impedance 508 may adjust the magnitude of input signal $I_{in}$ before it is input to the base terminal 506 of transistor $Q_2$, and therefore may have any suitable value, as well as being implemented in any suitable manner (e.g., as a resistor, a capacitor, or any combination of electronic components). As shown, transistor $Q_2$ has a collector terminal 505 which is grounded, either directly (as shown) or through one or more biasing components (such as a capacitor) to maintain a voltage of the collector terminal above ground. The transistor $Q_2$ produces an output signal on line 509 which is amplified in comparison to input signal $I_{in}$. In one implementation, the single-ended gain stage 204, implemented as shown in FIG. 5, produces an amplified signal on line 509 having a substantial amount of intermodulation distortion. In addition, the amplified signal on line 509 may comprise only a slight amplification of the input frequencies of the input signal $I_{in}$. Transistor $Q_2$ also has an emitter terminal 507 coupled to a second emitter degeneration impedance 503, which itself is coupled to ground. The second emitter degeneration impedance 503 may bias transistor $Q_2$, and may be implemented in any suitable form (e.g., as a resistor, etc.) and with any suitable value.

In circuit 500, inverter 210 comprises a third transistor $Q_3$. The transistor $Q_3$ is illustrated as a BJT, and comprises a base terminal 512, a collector terminal 513, and an emitter terminal 514. It will be appreciated that any of the transistors $Q_1$, $Q_2$, or $Q_3$ may alternatively be implemented as any suitable type of transistor, as a BJT is merely one non-limiting example. The emitter terminal 514 is coupled to a third emitter degeneration impedance 516, which itself is coupled to ground, and which may have any suitable form and value to bias transistor $Q_3$. The emitter terminal 514 is also coupled to the emitter terminal 507 of transistor $Q_2$ via an impedance 518. The impedance 518 may adjust the phase and magnitude of the amplified signal on line 509 that is provided to the emitter terminal 514 of transistor $Q_3$. Accordingly, the impedance 518 may have any suitable value, and may be implemented in any suitable form, such as a resistor, a capacitor, or any other electronic component or combination of electronic components.

The transistor $Q_3$ produces an inverted signal at the collector terminal 513, corresponding to an inversion of the amplified signal on line 509. According to one implementation, the inverted signal at collector terminal 513 may be approximately equal in magnitude, but approximately 180 degrees out-of-phase with, the amplified signal on line 509. However, proper selection of the circuit components (e.g., impedance element 518, transistor $Q_3$, etc.) may result in the signal at collector terminal 513 having any desired magnitude and phase relationship to the signal on line 509. The amplified signal on line 504 is added to the inverted signal at the collector terminal 513 of transistor $Q_3$ by an adder 214, which provides the output signal $I_{out}$ of the circuit 500. In the non-limiting implementation of FIG. 5, adder 214 is a node. However, it will be appreciated that other implementations of the adder 214 are possible, as the circuit 500 is not limited to any particular implementation of the adder 214.

The inverter 210 further comprises a first resistor $R_1$ and a first capacitor $C_1$. The input signal $I_{in}$ is provided to the base terminal 512 of transistor $Q_3$ via the resistor-capacitor network comprising $R_1$ and $C_1$. The capacitor $C_1$ may function to maintain the base terminal 512 of transistor $Q_3$ at an approximately constant voltage, i.e., capacitor $C_1$ grounds the AC component of the input signal $I_{in}$ provided to the base terminal 512 of transistor $Q_3$. Capacitor $C_1$ may therefore have any suitable value. The resistor $R_1$ may provide DC biasing to the base terminal 512 of transistor $Q_3$ and may have any suitable value for performing this function.

It will be appreciated that the non-limiting example of circuit 500 may be varied in multiple respects, while providing substantially the same functionality. For example, one or more of the impedances shown may be implemented as one or more electronic components, such as resistors, capacitors, inductors, or any combination thereof. The values of the impedances may be chosen to provide suitable functionality, and are not limited to any particular values. Other variations are also possible.

Figure 6:
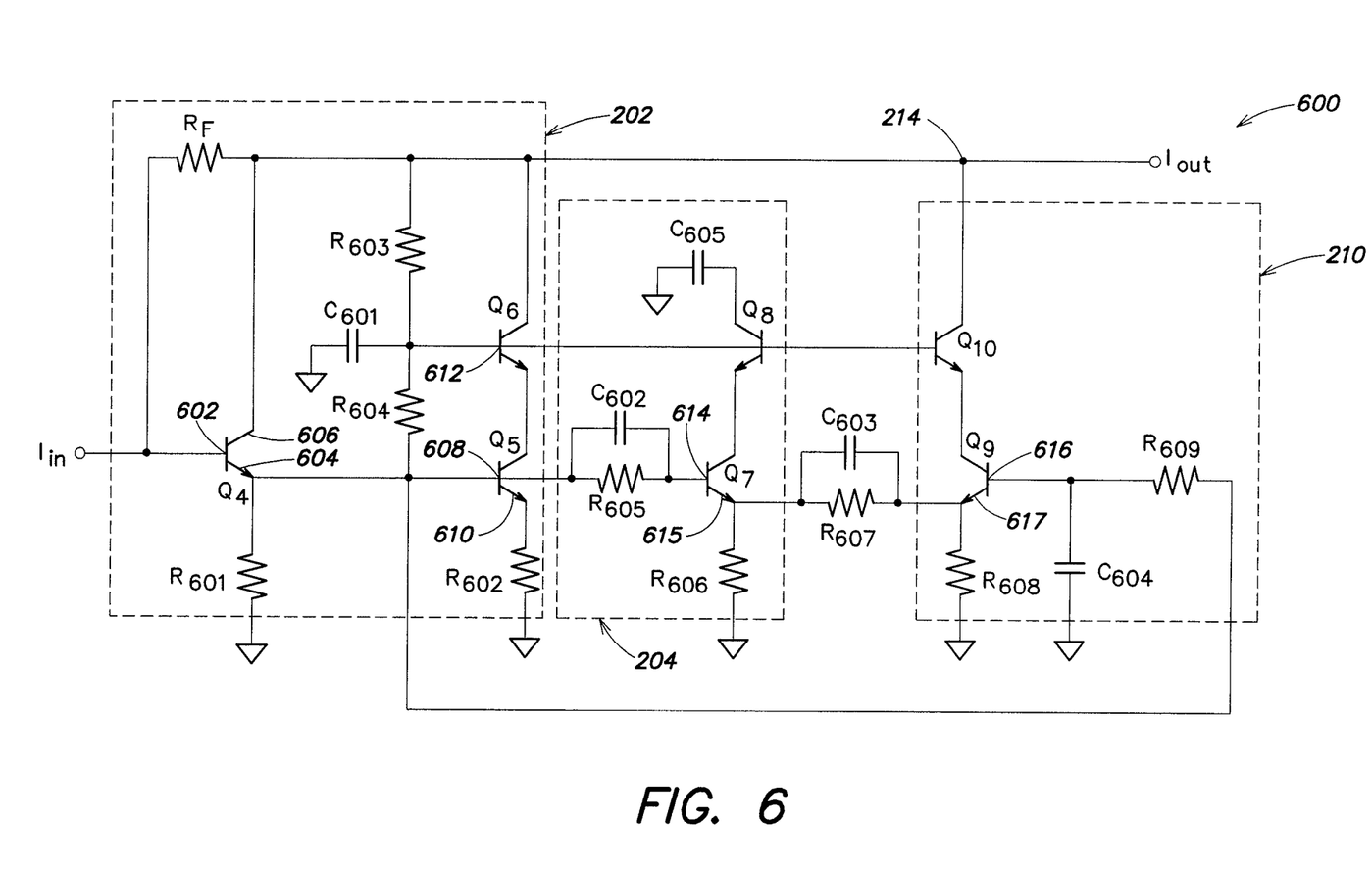
FIG. 6 is a circuit schematic of one exemplary implementation of circuit 200 from FIG. 2A.

FIG. 6 illustrates one non-limiting detailed implementation of the circuit 200 from FIG. 2A, expanding on the simplified circuit schematic of FIG. 5. It will be appreciated that other implementations are possible, as the aspect of the invention directed to a circuit providing an amplified output signal having little, or no, intermodulation distortion is not limited to any particular physical implementation.

In circuit 600, the single-ended gain stage 202 comprises three transistors $Q_4$, $Q_5$, and $Q_6$, each illustrated in this non-limiting example as BJTs. Transistors $Q_4$ and $Q_5$ are arranged as a Darlington Pair. Transistor $Q_4$ comprises a base terminal 602 configured to receive the input signal $I_{in}$ to the circuit 600. Transistor $Q_4$ also has an emitter terminal 604 coupled to an emitter degeneration impedance, illustrated as resistor $R_{601}$, which is grounded, and which may have any suitable value for biasing transistor $Q_4$. The output signal of single-ended gain stage 202 is provided at the collector terminal 606 of transistor $Q_4$. As shown, a feedback resistor $R_f$ is also included in the single-ended gain stage 202, to provide a feedback path between the amplified output signal of single-ended gain stage 202 at the collector terminal 606 of transistor $Q_4$ and the input terminal of circuit 600 (corresponding to base terminal 602 of transistor $Q_4$). The feedback resistor may control the gain of circuit 600, and therefore may have any suitable value, as the non-limiting implementation in FIG. 6 is not limited to any particular value for this resistor.

Transistors $Q_5$ and $Q_6$ of single-ended gain stage 202 are arranged in a cascode configuration, and may increase the bandwidth of the single-ended gain stage 202. As shown, transistor $Q_5$ has a base terminal 608 coupled to the emitter terminal 604 of transistor $Q_4$, and an emitter terminal 610 coupled to a second emitter degeneration impedance, illustrated as resistor $R_{602}$, which is grounded. Resistor $R_{602}$ may function to bias transistor $Q_5$ and therefore may have any suitable value. As mentioned, transistor $Q_5$ is configured in a cascode configuration with transistor $Q_6$, the collector terminal of transistor $Q_5$ being coupled to an emitter terminal of transistor $Q_6$. The collector terminal of transistor $Q_6$ is coupled to the collector terminal 606 of transistor $Q_4$. A base terminal 612 of transistor $Q_6$ is biased with a voltage divider comprising resistors $R_{603}$ and $R_{604}$, the values of which may be chosen to provide a desired level of biasing to the base terminal 612 of transistor $Q_6$, as the circuit 600 is not limited to any particular values for resistors $R_{603}$ and $R_{604}$. As shown, the base terminal 612 of transistor $Q_6$ may be coupled to ground by a capacitor $C_{601}$, which may maintain the base terminal 612 above ground and may have any suitable value.

In the non-limiting example of circuit 600, single-ended gain stage 204 comprises two transistors $Q_7$ and $Q_8$, both illustrated as BJTs. Transistor $Q_7$ has a base terminal 614 configured in parallel with the single-ended gain stage 202 to receive the input signal $I_{in}$ to the circuit 600 via an RC subcircuit comprising a capacitor $C_{602}$ in parallel with a resistor $R_{605}$. As shown, the signal provided to the RC subcircuit is provided by the emitter terminal of transistor $Q_4$, and is described herein as the input signal since it is the same as $I_{in}$, but with a different magnitude provided by the amplification of the Darlington Pair comprising $Q_4$ and $Q_5$. The combination of capacitor $C_{602}$ and resistor $R_{605}$ may adjust the magnitude of the signal input to base terminal 614 of transistor $Q_7$, and these elements may take any suitable values. Transistor $Q_7$ also has an emitter terminal 615 coupled to ground via an emitter degeneration impedance, illustrated as resistor $R_{606}$. The resistor $R_{606}$ may function to bias transistor $Q_7$ and may have any suitable value. The single-ended gain stage 202 further comprises transistor $Q_8$ configured in a cascode configuration with transistor $Q_7$, with an emitter terminal of transistor $Q_8$ coupled to a collector terminal of transistor $Q_7$. The transistor $Q_8$ also has a collector terminal which may be grounded, either directly, or through one or more biasing components, such as a capacitor $C_{605}$, to maintain a voltage of the collector terminal of transistor $Q_8$ above ground. The base terminal of transistor $Q_8$ is also connected to the midpoint of the voltage divider formed by $R_{603}$ and $R_{604}$, and therefore is coupled to the base terminal of 612 of transistor $Q_6$. The cascode configuration of transistors $Q_7$ and $Q_8$ may increase the bandwidth operation of the single-ended gain stage 204.

The output signal of single-ended gain stage 204 is provided at the emitter terminal 615 of transistor $Q_7$ to inverter 210 via an RC subcircuit comprising a capacitor $C_{603}$ in parallel with a resistor $R_{607}$. Capacitor $C_{603}$ and resistor $R_{607}$ may adjust the phase and magnitude of the signal input to inverter 210, and may have any suitable values. The inverter 210 comprises two transistors $Q_9$ and $Q_{10}$ arranged in a cascode configuration, implemented by coupling an emitter terminal of transistor $Q_{10}$ with a collector terminal of transistor $Q_9$, which may increase the bandwidth of operation of the inverter 210. Thus, it will be appreciated that each of the components, single-ended gain stage 202, single-ended gain stage 204, and inverter 210, implement a cascode configuration in the non-limiting example of FIG. 6. Moreover, the base terminals of transistors $Q_6$, $Q_8$, and $Q_{10}$ are arranged in parallel and coupled to capacitor $C_{601}$, which may maintain the base terminals above ground. However, other configurations are possible, as a cascode configuration is only one possible implementation.

As shown, transistor $Q_9$ receives the amplified output signal of single-ended gain stage 204 at an emitter terminal 617, which is coupled to ground via an emitter degeneration impedance, illustrated as resistor $R_{608}$. Resistor $R_{608}$ may bias transistor $Q_9$, and therefore may have any suitable value for this function. The inverter 210 further comprises a resistor R and a capacitor $C_{604}$ coupled to a base terminal 616 of transistor $Q_9$. The signal from the emitter terminal 604 of transistor $Q_4$, which as described is essentially the same as the input signal $I_{in}$, is provided to the base terminal 616 of transistor $Q_9$ via the resistor $R_{609}$, which may control the DC bias of the base terminal 616. The capacitor $C_{604}$ may function to maintain the base terminal 616 of transistor $Q_9$ at an approximately constant value, i.e., capacitor $C_{604}$ grounds an AC component of the signal provided to the base terminal 616 of transistor $Q_9$. Resistor $R_{609}$ and capacitor $C_{604}$ may have any suitable values for their respective functions.

The output signal $I_{out}$ is provided at adder 214, which in the non-limiting example of FIG. 6 is a node. The node represents a common point for the collector terminal 606 of transistor $Q_4$, a collector terminal of transistor $Q_6$, and a collector terminal of transistor $Q_{10}$. The output signal $I_{out}$ may include the input frequencies of input signal $I_{in}$, with those frequencies being amplified. Furthermore, the output signal $I_{out}$ may include little, or no, distortion, and particularly may include little, or no, third order intermodulation distortion.

It will be appreciated that the values of the resistors and capacitors within circuit 600 are not limited to any particular values. The value of each may be selected to provide suitable functionality. It will also be appreciated that one or more of the resistive or capacitive components illustrated may be omitted, or that additional components may be included in the circuit 600.

Figure 7:
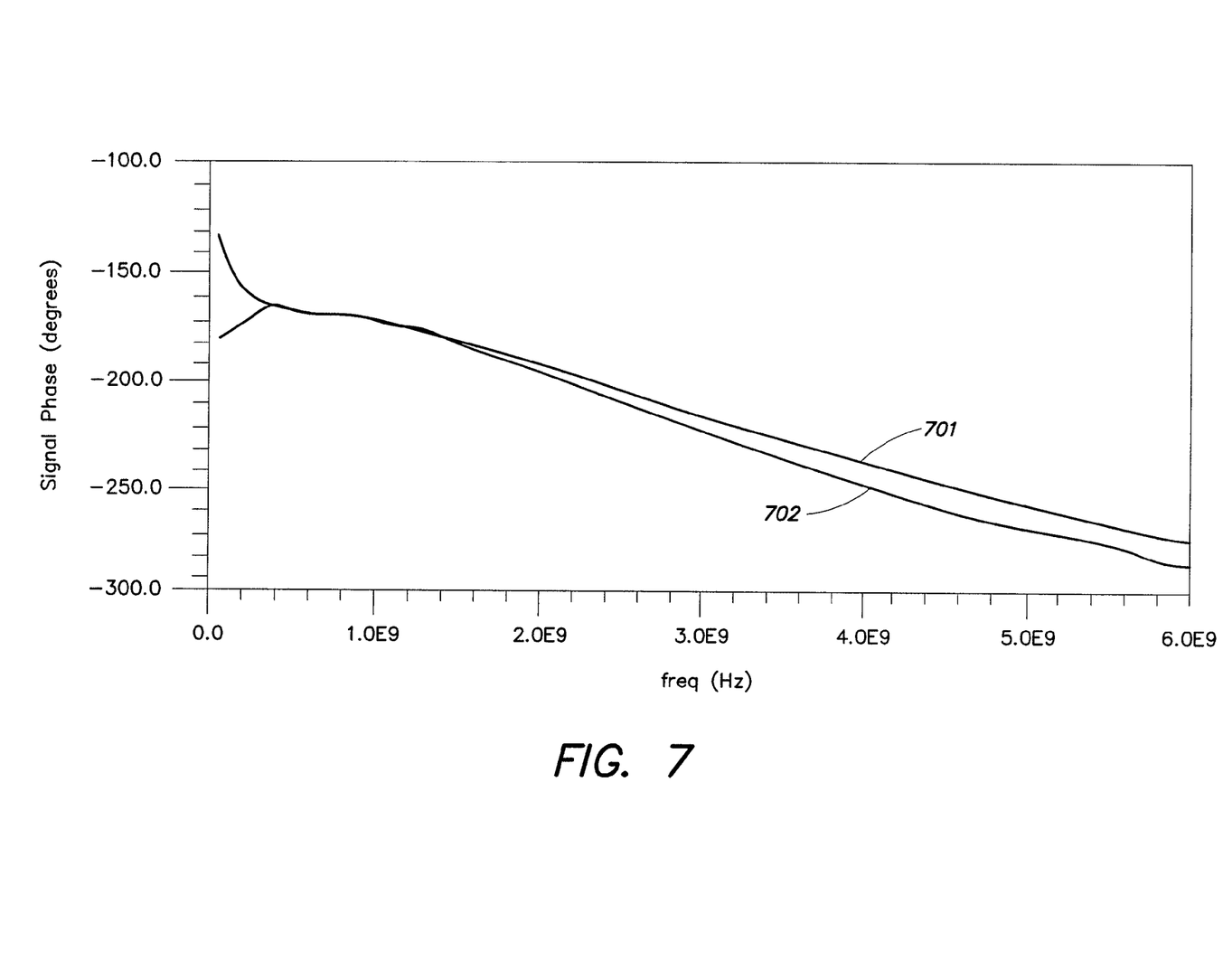
FIGS. 7 and 8 are simulation results illustrating characteristics of distortion that may occur in circuits of the type described herein.
Figure 8:
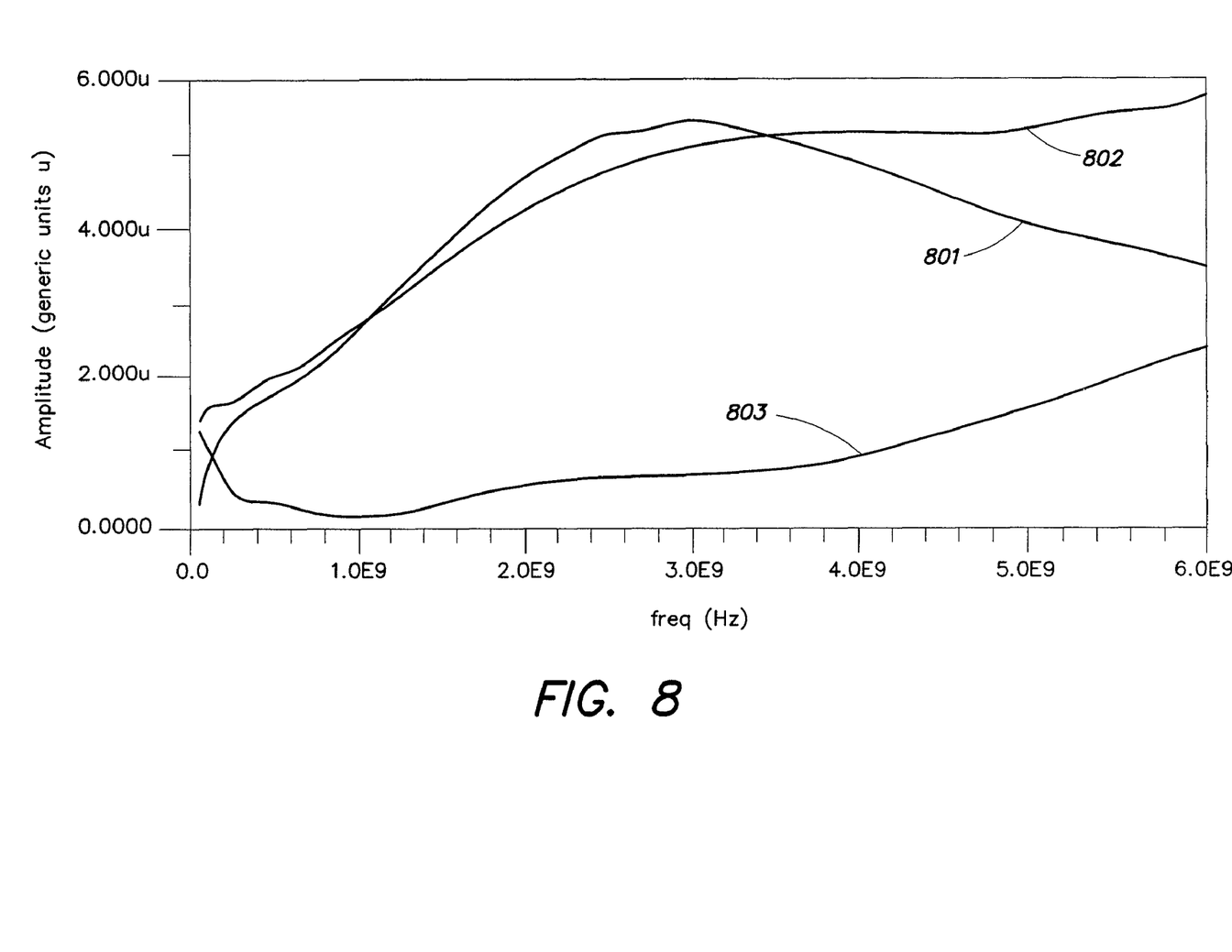
Figure 9:
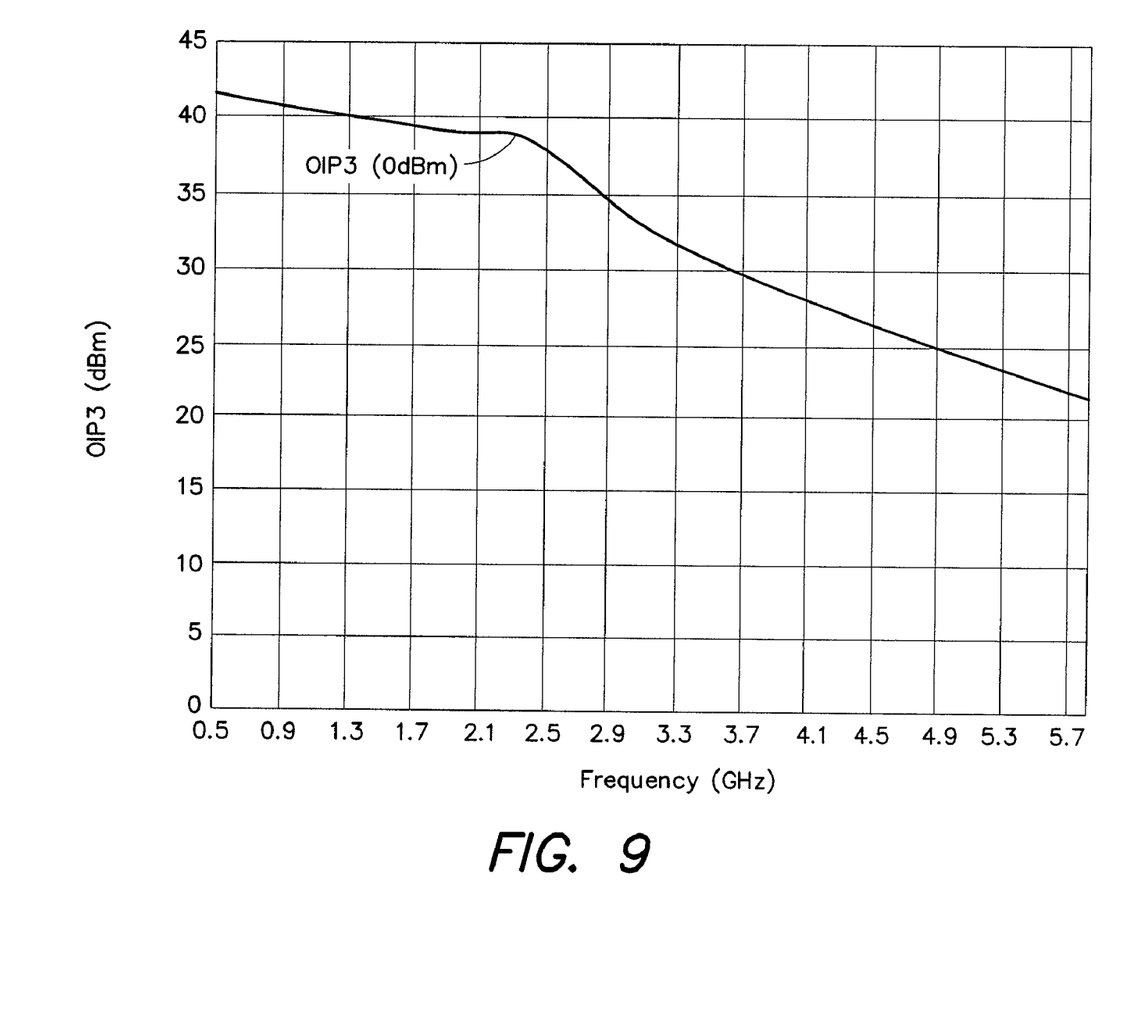
FIG. 9 is a simulation result illustrating an exemplary relationship between the output intercept point for third order intermodulation (OIP3) and frequency, for a circuit of the type described herein.

FIGS. 7-9 illustrate non-limiting examples of the operation of circuits of the type shown in FIGS. 5-6. FIG. 7 is a simulation illustrating the phase relationship between the intermodulation distortion of signals generated by two single-ended gain stages as a function of frequency, and therefore could correspond to the intermodulation distortion of the signals on lines 504 and 509 of FIG. 5. The x-axis lists the frequency of the intermodulation distortion signals (in units of Hz) and the y-axis lists the phase in units of degrees. As shown, the two intermodulation distortion signals 701 and 702 are substantially in-phase (i.e., their phases are approximately equal) over a wide range of frequencies, from zero (0) Hz to $6\times10^9$ Hz.

FIG. 8 illustrates a simulation of the amplitude of the intermodulation distortion of two signals 801 and 802 from circuits of the type described, and could, for example, correspond to the intermodulation distortion of the signals on lines 504 and 509 of FIG. 5. The x-axis shows the frequency of the signals (in Hz) and the y-axis shows the magnitude of the signals, in generic units (u). A third line 803 is also shown on the graph, corresponding to the magnitude of the intermodulation distortion resulting from subtracting the intermodulation distortion 801 from the intermodulation distortion 802. As shown, the intermodulation distortion 803 can be significantly reduced compared to the intermodulation distortion 801 and 802 over a wide range of frequencies.

FIG. 9 illustrates simulation results of one non-limiting example of an output intercept point for third order intermodulation (OIP3) distortion as a function of frequency, for a circuit of the type described herein and an input power of zero (0) dBm/tone (as indicated on the graph). The OIP3 (given by the equation $OIP_3 = P_{out} + \frac{1}{2}(P_{out} - IM_3)$, where $P_{out}$ is the output power of the amplifier and $IM_3$ is the difference between the magnitude of the third order intermodulation distortion and the magnitude of the fundamental output frequencies, e.g., frequencies $f_1$ and $f_2$ in FIG. 3) is a measure of the linearity of the circuit, with a higher OIP3 value corresponding to a device having greater linearity (i.e., less third order intermodulation distortion) than a device having a lower OIP3 value. As shown, circuits of the type described herein may exhibit relatively high OIP3 values over a large range of frequencies.

It will be appreciated that various alternatives exist for the non-limiting examples illustrated and discussed above. For example, while several of the circuits have been illustrated as including BJT transistors, other forms of transistors may alternatively be used. For example, heterojunction bipolar transistors (HBT), pseudomorphic high electron mobility transistors (pHEMT), field effect transistors (FET), or other types of transistors may be used. Furthermore, while various input signals have been illustrated and described as comprising two frequencies (or tones), it will be appreciated that the circuits and methods described herein may be used with other types of input signals. For example, circuits of the type described herein may be used with input signals comprising a single frequency. Alternatively, the circuits described herein may be used with input signals comprising any number of frequencies, such as two input frequencies, three input frequencies, or any other number input frequencies. The number of frequencies may depend on an operating environment of the circuit, as, for example, cellular telephone environments may include eight or more frequency channels. Similarly, various aspects of the invention may be implemented in various operating settings, such as communication systems (e.g., cellular communications systems), as the circuits and methods described herein are not limited to implementation in any particular system or operating environment. Furthermore, it will be appreciated that the circuits and methods described herein are not limited to operation with signals of any particular frequency. For example, the input and output signals may be low frequency signals or high frequency signals, as the various aspects of the invention are not limited in this respect. Furthermore, while some of the discussion above has discussed third-order intermodulation distortion, it will be appreciated that the methods and circuits described herein may be employed to minimize other types or degrees of distortion.

Furthermore, one or more of the impedance elements (i.e., resistors and capacitors) illustrated in the circuits may have values chosen to tune phase the magnitude of the signals at the various stages of the circuits. For example, the values of capacitors $C_{602}$ and $C_{603}$ may be selected so that the inverter 210 provides an inverted signal approximately 180 degrees out of phase with the output of the first single-ended gain stage. The circuits described above are not limited to being implemented with impedance elements of any particular value.

Having thus described several aspects of the invention, it is to be appreciated various alterations, modifications, and improvements will readily occur to those skilled in the art. Such alterations, modification, and improvements are intended to be part of this disclosure, and are intended to be within the spirit and scope of the aspects of the invention. Accordingly, the foregoing description and drawings are by way of example only.

The invention claimed is:

1. An apparatus comprising:
    an integrated circuit (IC) comprising:
        a first single-ended gain stage configured to receive an input signal, amplify the input signal, and produce a first amplified signal, wherein the first single-ended gain stage comprises a first transistor comprising a first terminal configured to receive the input signal and a second terminal configured to provide the first amplified signal;
        a second single-ended gain stage in parallel with the first single-ended gain stage and configured to receive the input signal, amplify the input signal, and produce a second amplified signal, wherein the second single-ended gain stage comprises a second transistor comprising a first terminal configured to receive the input signal and a second terminal configured to provide the second amplified signal, wherein the second single-ended gain stage further comprises a first impedance element coupled to the first terminal of the second transistor, and wherein the first terminal of the second transistor receives the input signal via the first impedance element, and wherein the second single-ended gain stage further comprises a third transistor arranged in a cascode configuration with the second transistor;
        an inverter coupled to the second single-ended gain stage and configured to receive the second amplified signal and produce an inverted signal representing an inversion of the second amplified signal; and
        an adder configured to add the first amplified signal and the inverted signal to produce an output signal of the IC.

2. An apparatus comprising:
    an integrated circuit (IC) comprising:
        a first single-ended gain stage configured to receive an input signal, amplify the input signal, and produce a first amplified signal, wherein the first single-ended gain stage comprises a first transistor comprising a first terminal configured to receive the input signal and a second terminal configured to provide the first amplified signal;
        a second single-ended gain stage in parallel with the first single-ended gain stage and configured to receive the input signal, amplify the input signal, and produce a second amplified signal, wherein the second single-ended gain stage comprises a second transistor comprising a first terminal configured to receive the input signal and a second terminal configured to provide the second amplified signal, and wherein the second single-ended gain stage further comprises a first impedance element coupled to the first terminal of the second transistor, and wherein the first terminal of the second transistor receives the input signal via the first impedance element;
        an inverter coupled to the second single-ended gain stage and configured to receive the second amplified signal and produce an inverted signal representing an inversion of the second amplified signal, wherein the inverter comprises a first resistor and a third transistor, the first resistor coupled to a first terminal of the third transistor, the first terminal of the third transistor configured to receive the input signal via the first resistor, and wherein the third transistor further has a second terminal configured to receive the second amplified signal and a third terminal configured to provide the inverted signal; and
        an adder configured to add the first amplified signal and the inverted signal to produce an output signal of the IC.

3. The apparatus of claim 2, wherein the third terminal of the third transistor is directly connected to the second terminal of the first transistor.

4. The apparatus of claim 3, wherein the first terminal of the third transistor is coupled to ground via a first capacitor.

5. The apparatus of claim 2, wherein the IC further comprises a second impedance element coupled between the second terminal of the second transistor and the second terminal of the third transistor.

6. The apparatus of claim 5, wherein the inverter further comprises a fourth transistor arranged in a cascode configuration with the third transistor.

7. The apparatus of claim 5, wherein the second impedance element comprises a capacitor in parallel with a resistor to control a phase and magnitude of a signal provided to the second terminal of the third transistor.

8. An apparatus comprising:
an integrated circuit (IC) comprising:
a first single-ended gain stage configured to receive an input signal, amplify the input signal, and produce a first amplified signal, wherein the first single-ended gain stage comprises a first transistor comprising a first terminal configured to receive the input signal and a second terminal configured to provide the first amplified signal, and wherein the first single-ended gain stage further comprises a feedback resistor coupled between the first and second terminals of the first transistor;
a second single-ended gain stage in parallel with the first single-ended gain stage and configured to receive the input signal, amplify the input signal, and produce a second amplified signal;
an inverter coupled to the second single-ended gain stage and configured to receive the second amplified signal and produce an inverted signal representing an inversion of the second amplified signal; and
an adder configured to add the first amplified signal and the inverted signal to produce an output signal of the IC.

9. The apparatus of claim 8, wherein first single-ended gain stage further comprises a second transistor and a third transistor arranged in a cascode configuration between the second terminal of the first transistor and ground.

10. A method of producing an amplified signal, the method comprising:
amplifying an input signal using a first single-ended gain stage to produce a first amplified signal, wherein the input signal is a multi-frequency signal comprising a first frequency and a second frequency, and wherein the first amplified signal is a multi-frequency signal comprising the first frequency, the second frequency, and third order intermodulation distortion;
amplifying the input signal using a second single-ended gain stage to produce a second amplified signal;
inverting the second amplified signal to produce an inverted signal; and
combining the first amplified signal and the inverted signal, wherein combining the first amplified signal and the inverted signal comprises adding the first amplified signal and the inverted signal.

11. The method of claim 10, wherein the inverted signal is a multi-frequency signal comprising the first frequency, the second frequency, and the third order intermodulation distortion, and wherein an absolute value of an amplitude of the third order intermodulation distortion of the inverted signal is approximately equal to an absolute value of an amplitude of the third order intermodulation distortion of the first amplified signal so that adding the first amplified signal and the inverted signal produces an output signal substantially free of the third order intermodulation distortion.

12. The method of claim 11, wherein the first frequency of the first amplified signal has a first amplitude, the second frequency of the first amplified signal has a second amplitude, the first frequency of the inverted signal has a third amplitude, and the second frequency of the inverted signal has a fourth amplitude, and wherein an absolute value of the third amplitude is less than approximately half of an absolute value of the first amplitude, and an absolute value of the fourth amplitude is less than approximately half of an absolute value of the second amplitude.

* * * * *

UNITED STATES PATENT AND TRADEMARK OFFICE
CERTIFICATE OF CORRECTION

PATENT NO. : 7,750,734 B2  
APPLICATION NO. : 12/077895  
DATED : July 6, 2010  
INVENTOR(S) : Bretchko et al.

Page 1 of 1

It is certified that error appears in the above-identified patent and that said Letters Patent is hereby corrected as shown below:

At column 7, line 33 (Approx.), please change "$I_{in}$" to --$I_1$--.
At column 4, line 54, please changeto "$I_{in}$" to --$I_{in}$,--.
At column 5, line 26, please change "$f_1$," to --$f_1$--.
At column 9, line 67, please change "R" to --$R_{609}$--.

Signed and Sealed this  
Eighth Day of March, 2011

David J. Kappos  
*Director of the United States Patent and Trademark Office*